(12) United States Patent
Fyten et al.

(10) Patent No.: US 7,951,724 B2
(45) Date of Patent: May 31, 2011

(54) WAFER FIXTURE FOR WET PROCESS APPLICATIONS

(75) Inventors: Steve Fyten, Ramsey, MN (US);
Matthew P. Dugas, St. Paul, MN (US);
John J. Marchetti, Blaine, MN (US)

(73) Assignee: Advanced Research Corporation, White Bear Lake, MN (US)

( * ) Notice: Subject to any disclaimer, the term of this patent is extended or adjusted under 35 U.S.C. 154(b) by 0 days.

(21) Appl. No.: 12/688,536

(22) Filed: Jan. 15, 2010

(65) Prior Publication Data

US 2010/0240222 A1    Sep. 23, 2010

Related U.S. Application Data

(63) Continuation of application No. PCT/US2008/070193, filed on Jul. 16, 2008.

(60) Provisional application No. 60/950,035, filed on Jul. 16, 2007.

(51) Int. Cl.
*H01L 21/461* (2006.01)

(52) U.S. Cl. ........ 438/745; 438/758; 118/503; 205/157; 205/640; 257/E21.219

(58) Field of Classification Search ............... 438/745, 438/758; 118/503; 205/157, 640
See application file for complete search history.

(56) References Cited

U.S. PATENT DOCUMENTS

| 7,169,280 B2 | 1/2007 | Klocke et al. |
| 7,210,991 B1 | 5/2007 | Van Der Veen et al. |

OTHER PUBLICATIONS

"AMMT Products, Electroplating—Wafer Holder Single EC with Electrical Contacts"; downloaded product specification on Jul. 15, 2008 from http://www.ammt.com/content/products/electroplating/index.html.

*Primary Examiner* — Alexander G Ghyka
(74) *Attorney, Agent, or Firm* — Dorsey & Whitney LLP; Nathan J. Witzany, Esq.

(57) ABSTRACT

The present invention is a wafer fixture comprising a housing body, a thrust plate, a flexure clamp, gaskets, flexure pins on an inner circumference of the housing body, locking grooves on an outer circumference of the flexure clamp, and a handle. A wafer may be placed between the gaskets of the housing body and the thrust plate. The flexure clamp may be placed over the thrust plate and secured to the housing body by rotating the flexure clamp such that locking grooves of the fixture plate mate with the flexure pins on the inner circumference of the housing body. The present invention in yet another embodiment is a wafer etch tool comprising a housing, a flexure clamp, and means for securing a wafer between the housing and the flexure clamp upon rotation of the flexure clamp within the housing.

19 Claims, 5 Drawing Sheets

WAFER FIXTURE FOR WET PROCESS APPLICATIONS

CROSS-REFERENCE TO RELATED APPLICATIONS

This application is a continuation of International Patent Application PCT/US2008/070193 filed Jul. 16, 2008, which claims priority to U.S. Ser. No. 60/950,035 filed Jul. 16, 2007, the contents of which are hereby incorporated by reference.

FIELD OF THE INVENTION

The present disclosure relates to apparatus and methods for a wafer fixture for wet process applications. More particularly, the present disclosure relates to apparatus and methods for a wafer fixture using an internal locking and docking mechanism for securing a wafer, which eliminates the use of several screws to secure the wafer.

BACKGROUND OF THE INVENTION

Current technologies of some wet processes for a wafer require that the wafer be etched or plated only on one side and perhaps only in the device region of that one side. That is, for technical reasons, etching or plating of the edge of the wafer is to be avoided. Some of these processes involve generic isotropic wet etching, anisotropic wet etching, e.g., KOH etching, plating, and various other wet operations.

In some applications the wafer fixture or fixture for holding the wafer is made of PEEK, and in other applications it may be made of stainless steel or titanium. The choice of material is based on the process requirements and upon manufacturing requirements of the fixture and costs. Some fixtures may be used for just one step and other fixtures may have to run more than one wet process. So, material choices can be complicated. In addition to chemical requirements, there may be thermal requirements of the process, and thus the fixture and its materials.

Heretofore, the preferred fixtures have been made in accordance with the prior art fixture of FIG. 1. The fixture 100 of FIG. 1 has a backing plate 110 and circular top frame 120. Both parts contain O-rings 130. A wafer is placed into fixture 100 and the wafer is clamped between the O-rings 130 by use of screws 140. The use of screws 140, however, makes for a tedious task of assembling the fixture 100 with the wafer in position, especially for multiple wafer baths. With the prior fixtures, the number of screws is limited in order to keep the task of assembly to a minimum. Therefore, the number of pressure points around the wafer is limited to the points where the screws are located, and the pressure on the wafer may be localized to the locations of the screws. That is, the pressure may not be equalized around the outer edge of the wafer. Additionally, there is a risk of losing the screws and dropping the screws onto the wafer surface, which is very undesirable.

Thus, there is a need in the art for a wafer fixture without the complications presented by prior wafer fixtures. There is a need in the art for an improved wafer fixture that is easier to use and assemble, has fewer total parts needed for assembly, and/or eliminates the risk of dropping a screw onto the wafer surface. Additionally, there is a need in the art for a wafer fixture using an internal locking and docking mechanism for securing a wafer, which eliminates the use of several screws to secure the wafer. There is a further need in the art for a wafer fixture wherein the number of pressure points retaining a wafer may be increased without increasing the complexity of or amount of time needed for assembling the wafer fixture.

BRIEF SUMMARY OF THE INVENTION

The present invention, in one embodiment, is a wafer fixture comprising a housing body, a thrust plate, a flexure clamp, gaskets, flexure pins on an inner circumference of the housing body, locking grooves on an outer circumference of the flexure clamp, and a handle. A wafer may be placed between the gaskets of the housing body and the thrust plate. The flexure clamp may be placed over the thrust plate and secured to the housing body by rotating the flexure clamp such that the locking grooves of the flexure clamp mate with the flexure pins on the inner circumference of the housing body.

The present invention, in another embodiment, is a wafer etch tooling comprising a housing having at least one flexure pin around an inner circumference of the housing and a plate adapted to be secured to the housing. The plate comprises at least one locking groove and corresponding flexure arm. The at least one locking groove and corresponding flexure arm mate with the at least one flexure pin when the plate is secured to the housing.

The present invention in yet another embodiment is a wafer etch tool comprising a housing, a flexure clamp, and means for securing a wafer between the housing and the flexure clamp upon rotation of the flexure clamp within the housing.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the present invention, it is believed that the invention will be better understood from the following description taken in conjunction with the accompanying Figures, in which:

DETAILED DESCRIPTION

The present invention is a novel and advantageous wafer fixture that is easier to use and assemble, has fewer total parts needed for assembly, and/or eliminates the risk of dropping a screw onto the wafer surface. The wafer fixture may include an internal locking and docking mechanism for securing a wafer, which may eliminate the use of several screws to secure the wafer. The wafer fixture may protect the back surface and edges of the wafer from a wet process, thus exposing the front surface device area of the wafer to the wet process. The wafer fixture may be assembled together generally intrinsically and internally without the use of screws. The wafer may be self-aligning and self-clamping. The wafer fixture may be assembled together with only the use of one hand and may be used in conjunction with a laboratory robotic system. The wafer fixture may be adapted, configured, or used, for example, for generic isotropic wet etching, anisotropic wet etching, e.g., KOH etching, electrochemical etch-stop processes, plating, electroplating, etc.

Figure 1:
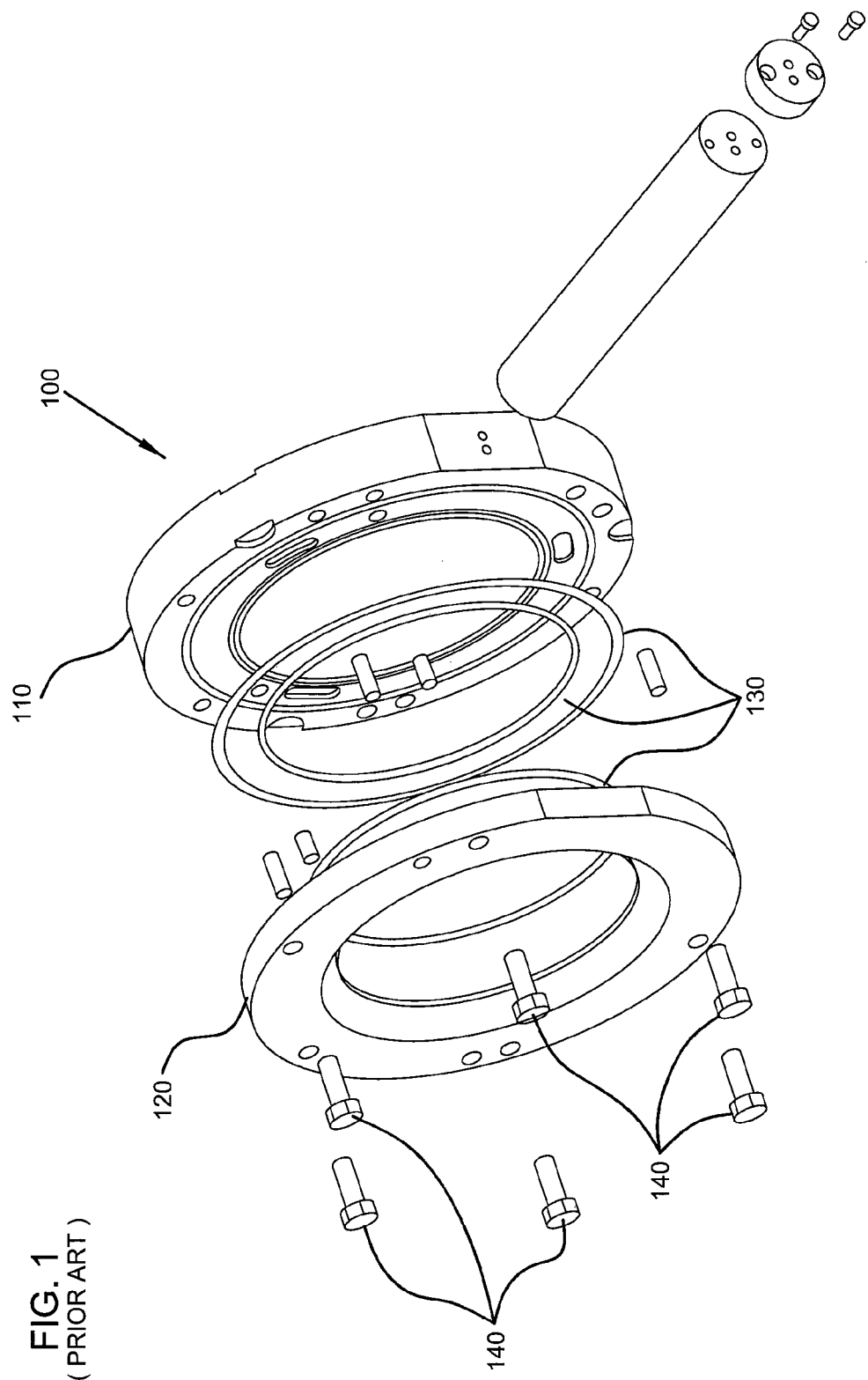
FIG. 1 is an exploded isometric view of a prior art wafer fixture.
Figure 2:
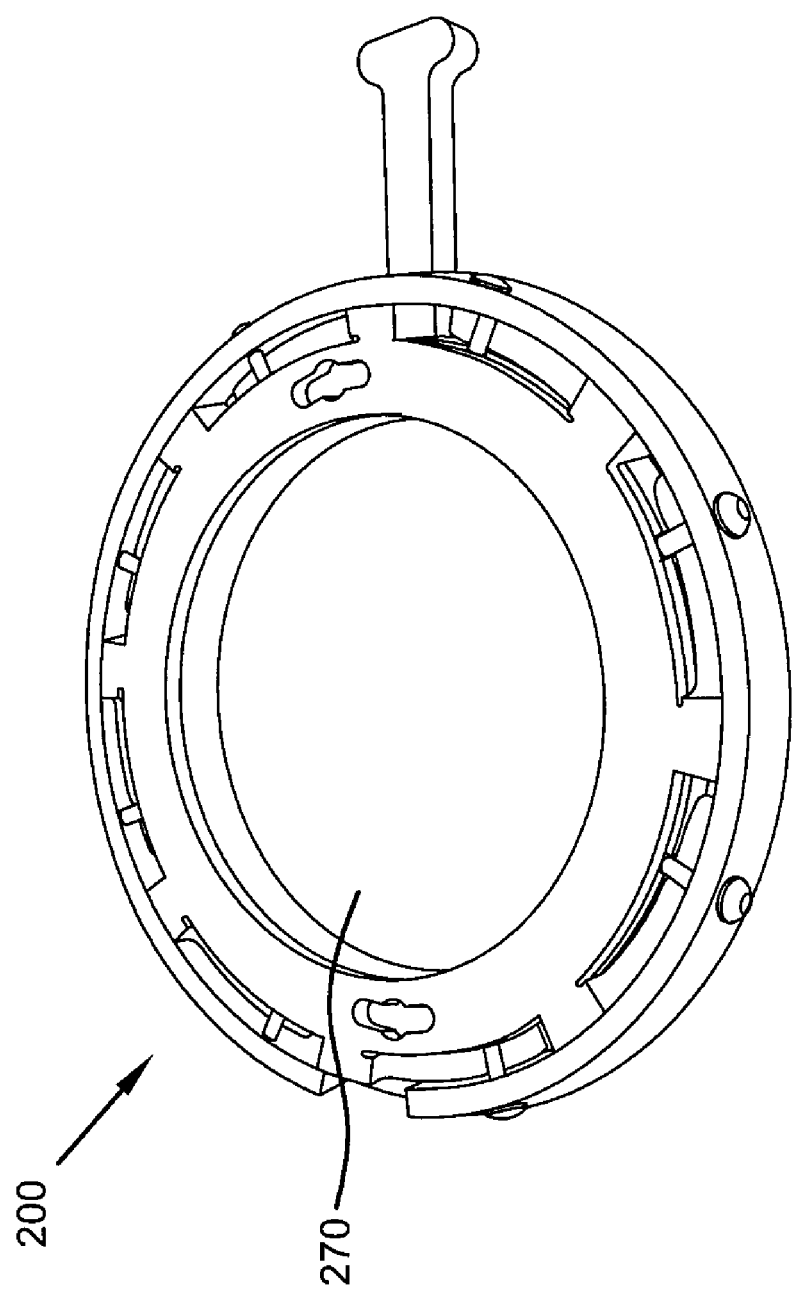
FIG. 2 is assembled view of a wafer fixture in accordance with an embodiment of the present disclosure.
Figure 3:
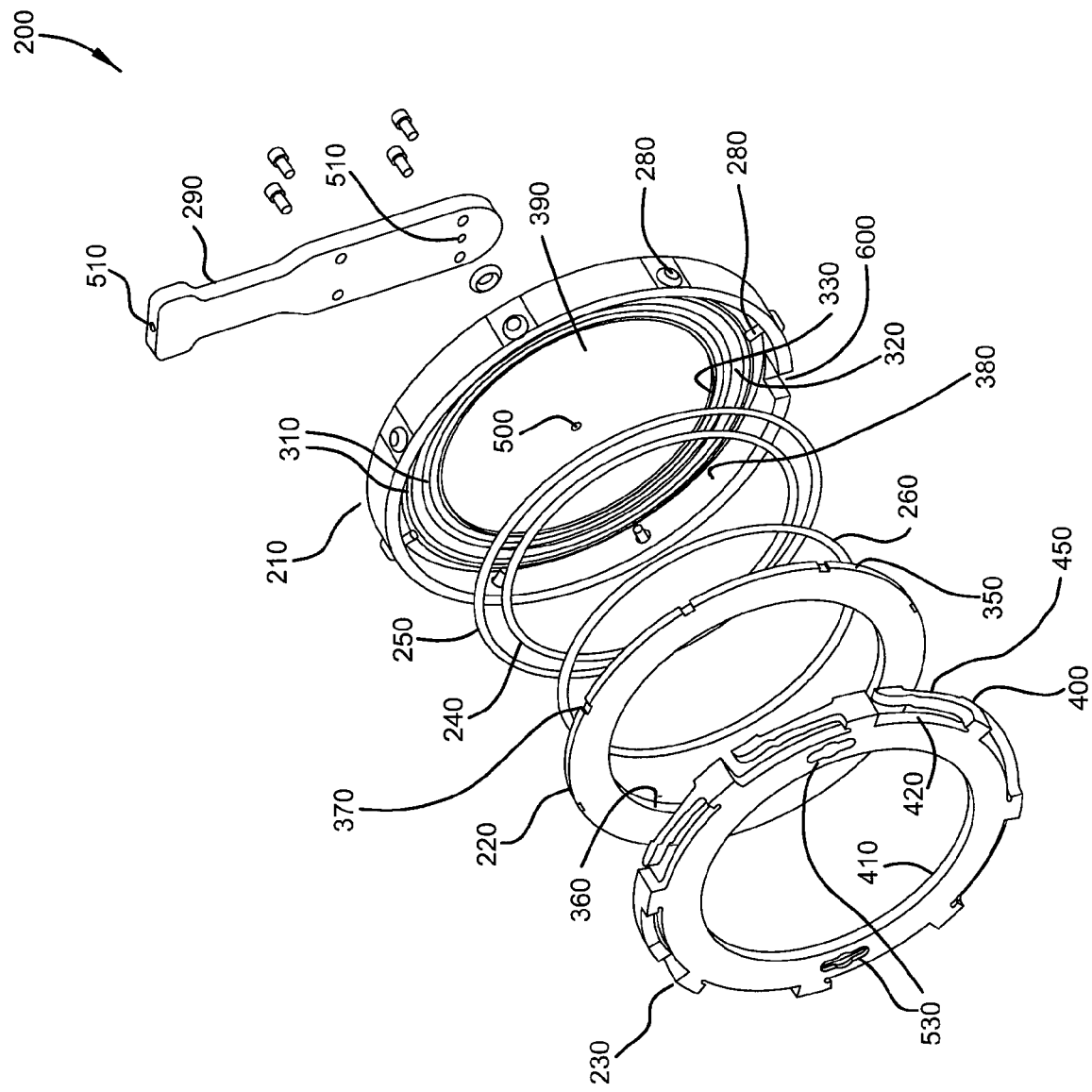
FIG. 3 is an exploded isometric view of the wafer fixture of FIG. 2 in accordance with an embodiment of the present disclosure.

FIG. 2 illustrates a wafer fixture 200, as described by the present disclosure, in an assembled state with a wafer 270 secured in place. With reference now to FIG. 3, a wafer fixture 200 as described in the present disclosure may comprise a housing body 210, a thrust plate 220, a flexure clamp 230, gaskets 240, 250, and 260, flexure pins 280, and a handle 290. The wafer fixture 200, or components of the wafer fixture, may be manufactured from metal, metal alloys, plastics, composites, dielectrics, etc., or any combination thereof. In some embodiments, the wafer fixture 200, or components of the wafer fixture, may be manufactured from stainless steel, titanium, Polyetheretherketones (PEEK), or a combination thereof. The wafer fixture 200 may also include a setting tool 300, illustrated in FIG. 5, for placing the flexure clamp 230 in position.

The housing body 210 may comprise grooves 310 for retaining gaskets 240 and 250. The gaskets 240 and 250 may be positioned into the grooves 310 prior to placing a wafer 270 onto the housing body 210. The gaskets 240 and 250 may be O-ring gaskets. The gaskets 240 and 250 may be manufactured from plastic, rubber, or any other suitable material. Generally, the outer gasket 250 may have a larger diameter than the inner gasket 240. In some embodiments, the gaskets 240 and 250 may be removable and replaceable.

A wafer 270, such as a Microelectromechanical Systems (MEMS) or semiconductor wafer, may be positioned in the housing body 210, such that the wafer 270 is positioned on top of the inner gasket 240. The inner gasket 240 may support the wafer 270 in a position just above a wafer pocket 390 of the housing body 210. In other words, in one embodiment, a small gap may exist between the wafer 270 and the wafer pocket 390 of the housing body 210. The inner gasket 240 may also keep etchant from reaching the back surface of the wafer 270. In addition, the housing body 210 may include a raised annular portion 320 having a rim 330. The outer gasket 250 may be positioned on the raised annular portion 320. The raised annular portion 320 may surround the wafer pocket 390 and may create the outer edge of the wafer pocket 390. The wafer 270 may be positioned on top of the inner gasket 240, such that the edge of the wafer 270 may abut or be generally adjacent to the rim 330 of the raised annular portion 320, thereby held in position within the raised annular portion 320. The housing body 210 may further include an opening or groove 600 on the circumference of the outer flanged edge of the housing body 210. The groove 600 may generally make it easier to access a wafer 270 in the housing body 210 using a wafer grip or the like.

A thrust plate 220 may be positioned within the housing body 210, so that the wafer 270 is positioned between the housing body 210 and the thrust plate 220. More particularly, the edge of the wafer may be positioned between the housing body 210 and the thrust plate 220 leaving a front etching surface of the wafer 270 exposed. The thrust plate 220 may be generally circular in shape with an outer annular edge 350 and an inner annular edge 360 (e.g., an annular ring). The thrust plate 220 may also have two side surfaces, including an outer side surface that faces away from the housing body 210 and an inner side surface that faces toward the housing body 210. The thrust plate 220 may be manufactured from the same or different material as the housing body 210. In some embodiments, the thrust plate 220 may be manufactured from other suitable materials such as rubber, plastic, Teflon®, etc., or any combination thereof. The thrust plate 220 may include a groove on the inner side surface for retaining gasket 260. The gasket 260 may be positioned into the groove prior to placing the thrust plate 220 within the housing body 210. The gasket 260 may be an O-ring gasket. The gasket 260 may be manufactured from plastic, rubber, or any other suitable material. In some embodiments, the gasket 260 may be removable and replaceable. In a further embodiment, the thrust plate 220 may provide the function of the gasket 260 and the gasket 260 may be eliminated.

The thrust plate 220 may be positioned within the housing body 210, so that the gasket 260 contacts the wafer 270 surface. As such, the wafer 270 may be positioned between the inner gasket 240 of the housing body 210 and the gasket 260 of the thrust plate 220. More particularly, the edge of the wafer 270 may be positioned between the inner gasket 240 of the housing body 210 and the gasket 260 of the thrust plate 220 leaving a front etching surface of the wafer 270 exposed. The gasket 260 of the thrust plate 220 may keep etchant from reaching the outer edge of the wafer 270 as etchant contacts the front surface of the wafer 270 during etching.

In further embodiments, the thrust plate 220 may have one or more notches 370 located around the outer annular edge 350. The notches 370 may align with, or mate with, one or more corresponding flexure pins 280 positioned around an inner circumference 380 of the housing body 210, as shown in FIG. 3. The inner circumference 380 of the housing body 210 may be provided on an inner wall created by an outer flanged edge of the housing body 210. The wafer pocket 390 may be recessed within the housing body 210 in relation to the inner circumference 380. In one embodiment, there may be eight notches 370 and eight corresponding flexure pins 280. However, in other embodiments, there may be greater or fewer notches 370 and corresponding flexure pins 280. In some embodiments, there may not be any notches 370. The notches 370 and flexure pins 280 may help center the thrust plate 220 within the housing body 210. The notches 370 and flexure pins 280 may also retain the thrust plate 220 from rotation within the housing body 210.

With the thrust plate 220 positioned within the housing body 210, the outer gasket 250 of the housing body 210 may contact the inner side surface of the thrust plate 220. The outer gasket 250 may, therefore, keep etchant from reaching the back surface and outer edge of the wafer 270. The gaskets 240, 250, and 260, thus, may allow etchant to only contact the front surface of the wafer 270. The thrust plate 220 may further provide protection to the wafer 270 from the rotating movement of the flexure clamp 230, described in further detail below, so that the wafer 270 is not damaged during locking of the flexure clamp 230.

In some embodiments, the thickness of the thrust plate 220 may be adapted to accommodate wafers 270 of varying thicknesses. Furthermore, the thrust plate 220 may include a lip or notch, such that a wafer grip, or the like, may be used to lift the thrust plate 220 from the housing body 210 and/or break a seal that may have formed between the thrust plate 220 and the wafer 270.

A flexure clamp 230 may be positioned over the thrust plate 220. In one embodiment, the thrust plate 220 may fit entirely within the flexure clamp 230. In other words, the flexure clamp 230 may have a larger diameter than the thrust plate 220. The flexure clamp 230 may be circular in shape and have an outer annular edge 400 and inner annular edge 410 (e.g., an annular ring). The flexure clamp 230 may also have two side surfaces, including an outer side surface that faces away from the housing body 210 and an inner side surface that faces toward the housing body 210. The flexure clamp 230 may be manufactured from the same or different material as the housing body 210 and/or the thrust plate 220.

In one embodiment, the inner annular edge 410 of the flexure clamp 230 may be shorter in width than the outer annular edge 400, such that the outer annular edge 400 extends further from the outer side surface towards the housing body 210 than the inner annular edge 410, as can be seen in FIG. 3.

The flexure clamp 230 may be positioned within the inner circumference 380 of the housing body 210. That is, the flexure clamp 230 may be generally adjacent to, and/or in contact with, the thrust plate 220 and the inner circumference 380 of the housing body 210.

As illustrated in FIGS. 3 and 4A-D, the outer annular edge 400 may include one or more locking grooves 420 for mating with flexure pins 280 of the housing body 210 in order to hold, or lock in place, the flexure clamp 230 to the housing body 210. In a further embodiment, the flexure clamp 230 may be securely held within the housing body 210 by the locking grooves 420 mating with the flexure pins 280. When the flexure clamp 230 is held in position by the flexure pins 280, the wafer 270 may be securely held between the flexure clamp 230, and thus the thrust plate 220, and the housing body 210. In one embodiment, there may be eight locking grooves 420 and eight corresponding flexure pins 280. However, in other embodiments, a greater or lesser number of locking grooves 420 and corresponding flexure pins 280 may be used.

In one embodiment, as shown in FIGS. 3 and 4A-D, a locking groove 420 may have a flexure arm 450 extending from a first side of the locking groove 420 in an annular direction corresponding to the outer annular edge 400 of the flexure clamp 230. The flexure arm 450 may not extend entirely to the other side of the locking groove 420, leaving an opening 460 between the flexure arm 450 and a second side of the locking groove 420. Generally, the opening 460 may be large enough for a flexure pin 280 to fit through as the flexure clamp 230 is positioned within the housing body 210. The flexure clamp 230 may be positioned so that each of the locking grooves 420 aligns with a corresponding flexure pin 280. As the flexure clamp 230 is positioned within the housing body 210 over the thrust plate 220, each of the flexure pins 280 will pass through the openings 460 in the locking grooves 420 in the direction of arrow A in FIG. 4A. The flexure clamp 230 may be rotated, for example in a counter-clockwise direction, so that the flexure pins 280 move in the direction of arrow B in FIG. 4A relative to the flexure clamp 230. In some embodiments, there may be some resistance to rotation of the flexure clamp 230 due to the flexure arms 450 of the locking grooves 420 contacting, or sliding against, the flexure pins 280. Such resistance may provide the force to securely support the flexure clamp 230 against the housing body 210, and therefore, the force to securely support the wafer 270 between the flexure clamp 230 and the housing body 210, or more particularly, between the gaskets 240 and 260. As previously stated, the thrust plate 220 may provide protection to the wafer 270 from the rotation of the flexure clamp 230.

Figure 4A:
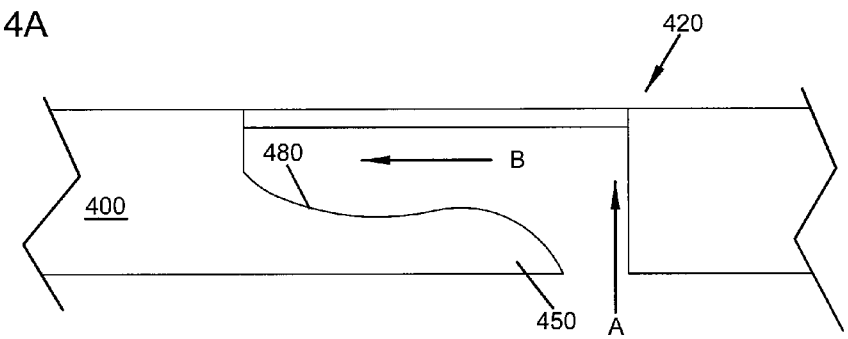
FIG. 4A is a side view of a locking groove in accordance with one embodiment of the present disclosure.

As illustrated in FIG. 4A, the flexure arms 450 may have generally flat bottom surfaces 470 corresponding to the inner side surface of the outer annular edge 400 and generally curved upper surfaces 480. The bottom surfaces 470 of the flexure arms 450 need not be flat and may be curved or have a cut-out of any shape. In some embodiments, the flexure arms 450 may be generally flexible. The upper surfaces 480 may ease resistance to rotation of the flexure clamp 230 by providing curved surfaces for the flexure pin 280 to contact or slide against.

Figure 4B:
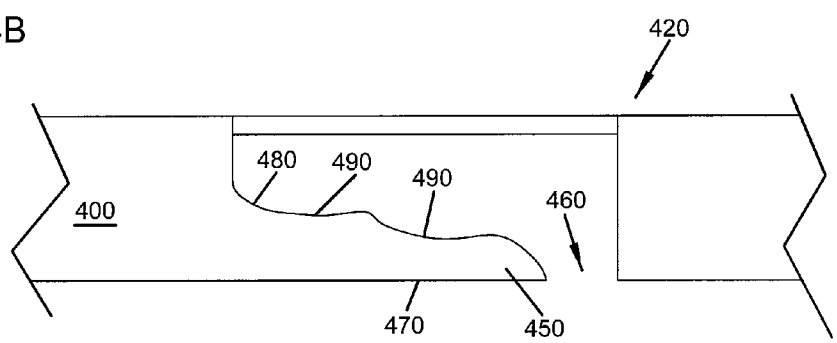
FIG. 4B is a side view of a locking groove having an arm with multiple detents in accordance with another embodiment of the present disclosure.
Figure 4C:
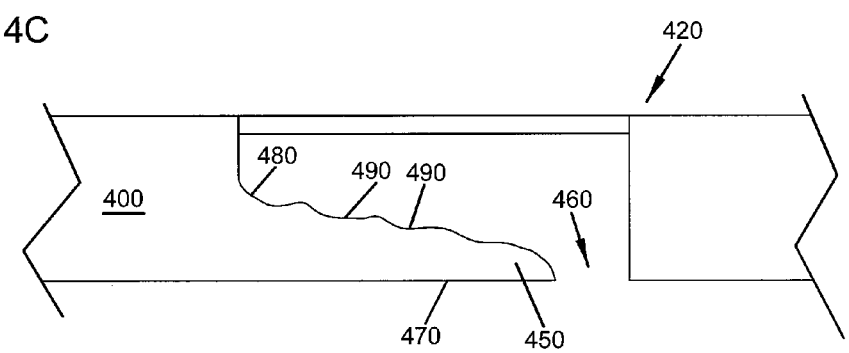
FIG. 4C is a side view of a locking groove having an arm with multiple detents in accordance with a further embodiment of the present disclosure.
Figure 4D:
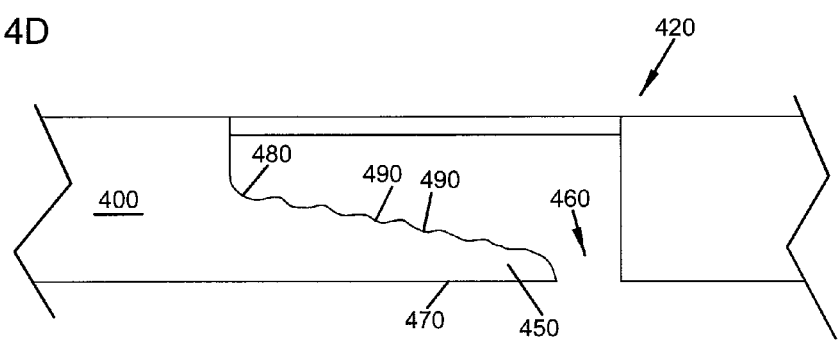
FIG. 4D is a side view of a locking groove having an arm with multiple detents in accordance with yet another embodiment of the present disclosure.

With reference now to FIGS. 4B-D, the flexure arms 450 may have curved upper surfaces 480 comprising one or more detents 490, such that the flexure pins 280 may be positioned in one of the detents 490. Providing more than one detent 480 may allow the flexure clamp 230 to be rotated and securely held at more than one rotational position along the flexure arms 450. Furthermore, the flexure arms 450 may generally slope in a downward angle towards the bottom surfaces 470 and the openings 460. As such, wafers 270 of different thicknesses may be accommodated by simply more or less rotation of the flexure clamp 230. In further embodiments, the detents 490 may provide a ratcheting effect during rotation of the flexure clamp 230. Such a flexure system may provide a precise amount of force/torque against the wafer 270. In some embodiments, a torque wrench or the like may be used with a flexure clamp 230 having multiple detents such that a precise amount of force/torque can be determined. In further embodiments, the setting tool 300, illustrated in FIG. 5, may include a torque readout and be used as a torque wrench for positioning the flexure clamp 230 with precise tightness.

The location of the flexure pins 280, locking grooves 420, and flexure arms 450 illustrated in the figures are exemplary. In alternative embodiments, it is recognized that the housing body 210 may comprise the flexure arms and locking grooves while the flexure clamp 230 may comprise radially outward extending, flexure pins to hold, or lock in place, the flexure clamp 230 to the housing body 210. Similarly, in other alternative embodiments, the flexure pins 280 may extend radially outward from the outer annular edge 400 of the housing body 210. As such, the flexure clamp may fit over the outer annular edge 400 of the housing body 210 and include corresponding locking grooves and flexure arms to hold, or lock in place, the flexure clamp 230 over, and to, the housing body 210. It is recognized that yet further configurations of the flexure pins 280, locking grooves 420, and flexure arms 450 may be used and fall within the spirit and scope of the present invention.

As previously stated, with the prior fixtures, the number of screws 140 used to retain the circular top frame 120 to the backing plate 110 is limited in order to keep the tedious task of assembly to a minimum. Therefore, the number of pressure points around the wafer is limited to the points where the screws are located, and the pressure on the wafer may be localized to the locations of the screws. That is, the pressure on the wafer may not be equalized around the entire outer edge of the wafer. With the embodiments of the present disclosure, the number of locking grooves 420 may be increased (or decreased) without adding any further tedious assembly of the flexure clamp 230 to the housing body 210. The flexure clamp 230 may be rotated with ease no matter the number of locking grooves 420 provided. Furthermore, providing a plurality of locking grooves 420 may help equalize pressure against the wafer 270 around the outer edge of the wafer 270.

The wafer fixture 200 may further have a handle 290. The handle 290 may be attached to the housing body 210. In some embodiments, the handle 290 may be an integrated component of the housing body 210. The handle 290 may be manufactured from the same or different material as the housing body 210.

The handle 290 may have a vent for allowing air to escape from the wafer fixture 200, and more particularly from between the wafer 270 and the housing body 210. The housing body 210 may have a heat escape bore 500 that allows air to escape from between the wafer 270 and the housing body 210. The escape bore 500 may pass entirely through the housing body 210 and may have one end generally located in the wafer pocket 390. The escape bore 500 may be located generally in the center of the housing body 210. However, the escape bore 500 may be located in any suitable location of the housing body 210 to allow air to escape from between the wafer 270 and the housing body 210. The handle 290 may also have a heat escape bore 510 that extends a portion of the length of the handle 290. The handle 290 may be attached to, or integrally formed with, the housing body 210, such that one end of the escape bore 510 meets one end of the escape bore 500 of the housing body 210. The handle 290 may be attached to, or integrally formed with, the side of the housing body 210 that is opposite the side in which the wafer 270 is placed. A second end of the escape bore 510 may be located at an end of the handle 290 that extends away from the housing body 210. However, it is recognized that the second end of the escape bore 510 may be located at any suitable position on the handle 290 to allow air to escape from the housing body 210 as disclosed. In further embodiments, the housing body 210 and/or the handle 290 may have more than one escape bores for allowing air to escape from between the wafer 270 and the housing body 270.

In some embodiments, the handle 290 and/or vent may have a filter. The filter may be porous and/or hydrophobic. The filter may keep condensation from forming and travelling through the heat escape bores 500 and 510 to the wafer 270. In some embodiments, the filter may be a plug that fits in, or is located in, one of the escape bores 500 or 510. In further embodiments, the filter may be manufactured from Teflon® or other suitable materials. A filter may be especially useful in vapor enclosed environments.

It is recognized that a vent may be provided that is separate from the handle 290, or no vent may be provided at all. The dimensions and shape of the handle 290 illustrated in FIG. 3 are exemplary, and the handle 290 may be any suitable size and shape. Typically, the handle 290 may be sized and shaped such that when the wafer fixture 200 (and wafer 270) is placed in an etchant, the handle 290 may rise above the level of the etchant. Additionally, the handle 290 may be used for ease of positioning in, and removal from, a wafer fixture holder.

Figure 5:
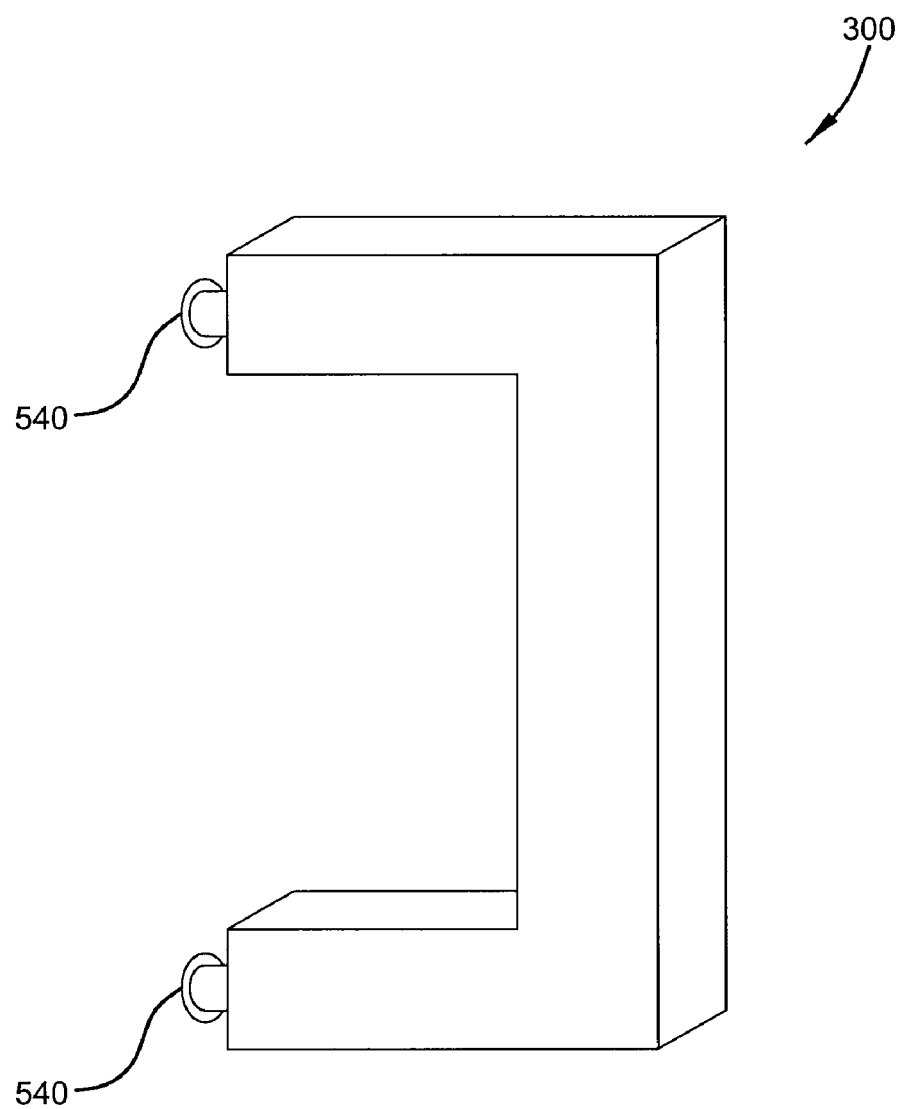
FIG. 5 is a perspective view of a setting tool in accordance with an embodiment of the present disclosure.

A setting tool 300 may be provided to aid in rotation and locking/unlocking of the flexure clamp 230. In one embodiment, the flexure clamp 230 may comprise a slot 530 for receiving an end of the setting tool 300. In other embodiments, such as illustrated in FIG. 3, the flexure clamp 230 may comprise two slots 530 for receiving one or more ends of the setting tool 300. In yet further embodiments, any suitable number of slots 530 may be provided on the flexure clamp 230. The setting tool 300 may, in one embodiment illustrated in FIG. 5, be shaped for use as a handle. However, the setting tool 300 may be any suitable shape for holding and using to rotate and lock/unlock the flexure clamp 230. The setting tool 300 may have a protrusion 540 at one end for mating the end with a slot 530 in the flexure clamp 230. In other embodiments, the setting tool 300 may have a protrusion on each end of the setting tool 300 for mating with more than one slot 530 in the flexure clamp 230. For example, as shown in FIG. 5, the setting tool 300 may have two protrusions 540 located on each of two ends of the setting tool 300. The setting tool 300 may then be removably attached to the flexure clamp 230 through use of the mating protrusions 540 and slots 530, and the setting tool 300 may be used to rotate and lock/unlock the flexure clamp 230 to the housing body 210. In some embodiments, the setting tool 300 may not include protrusions 540, and the ends of the setting tool 300 themselves may mate with the slots 530 of the flexure clamp 230. The setting tool 300 may also be used to place and remove the flexure clamp 230 in relation to the housing body 210. Although protrusions 540 and slots 530 are illustrated in FIG. 5, it is recognized that any suitable means for removably securing the setting tool 300 to the flexure clamp 230 for rotating and locking/unlocking the flexure clamp 230 may be used, such as magnets.

The wafer fixture 200, and thus the components of the wafer fixture 200, such as the housing body 210, thrust plate 220, flexure clamp 230, gaskets 240, 250, and 260, etc. may be adapted to fit any wafer size. For example, the wafer fixture 200 and its components may be sized to fit a wafer size of 75 mm, 100 mm, 150 mm, 200 mm, or any other suitable size wafer. Additionally, the wafer fixture 200, in some embodiments, can be modified for use with electrochemical etch stop processes or electroplating. In such embodiments, the wafer fixture 200 may include one or more electrical paddles or contacts. In typical exemplary embodiments, two or four electrical contacts may be provided. The contacts may be placed in the wafer fixture 200, such that they contact either the wafers back (e.g., electrochemical etch stop) or front surface (e.g., electroplating) and/or may be placed in the wafer fixture 200 according to the user's specifications, which may vary from one wafer fixture to another. The wafer fixture 200 further includes any electric circuitry or connections that are used to provide connections between external circuitry or power source and the electrical paddles or contacts of the wafer fixture 200. In one embodiment, such electrical connections may be provided, at least in part, through handle 290.

In a further embodiment, the wafer fixture 200 may have more than one housing body 210. For example, the wafer fixture may have a housing body 210 attached to one side of the handle 290 while a second housing body 210 may be attached to the other side of the handle 290. Thus, the wafer fixture, in one embodiment, may be double-sided and may be used for two wafers 270 at a single time. As such, more than one wafer 270 may be etched at one time using one wafer fixture. The components of each of the housing bodies of a double-sided, or tandem, wafer fixture may be generally the same as previously described in relation to a wafer fixture 200 having one housing body 210.

A base may be provided for holding or supporting the housing body 210 so that the flexure clamp 230 may be positioned within the housing body 210 easily and with the correct amount of torque applied. The base structure may also provide a way to position and tighten the flexure clamp 230 with the use of a single hand or ease assembly with the use of a robotic arm/system.

Although the present invention has been described with reference to preferred embodiments, persons skilled in the art will recognize that changes may be made in form and detail without departing from the spirit and scope of the invention.

We claim:

1. A wafer fixture assembly for retaining a wafer such that a surface of the wafer can be acted upon, the wafer fixture comprising:

a housing comprising a base and at least one flexure pin around an inner circumference of the housing, the base having a first sealing ring for receiving the wafer thereon;

a thrust plate configured to be received by the housing with the wafer positioned between the base and the thrust plate and including a second sealing ring for resting on a surface of the wafer; and a flexure clamp configured to be secured to the housing with the thrust plate positioned between the flexure clamp and the housing, the flexure clamp comprising at least one locking groove and corresponding flexure arm, the at least one locking groove and corresponding flexure arm mating with the at least one flexure pin when the flexure clamp is secured to the housing;

wherein the flexure clamp and thrust plate are configured to expose a surface of the wafer.

2. The wafer fixture of claim 1, wherein the housing comprises a plurality of flexure pins and the flexure clamp comprises a plurality of corresponding locking grooves and flexure arms.

3. The wafer fixture of claim 2, wherein the flexure arms comprise a plurality of detents for adjustable torque.

4. The wafer fixture of claim 1, wherein the flexure clamp is secured to the housing by positioning the at least one flexure pin in a corresponding at least one locking groove of the flexure clamp and rotating the flexure clamp until that the at least one flexure pin of the housing is retained by the corresponding flexure arm.

5. The wafer fixture of claim 4, wherein the thrust plate is configured to remain stationary while the flexure clamp is rotated.

6. The wafer fixture of claim 5, wherein the thrust plate comprises at least one groove around an outer edge, the at least one groove adapted to receive the at least one flexure pin of the housing so that the thrust plate remains stationary while the flexure clamp is rotated.

7. The wafer fixture of claim 1, further comprising a handle.

8. The wafer fixture of claim 7, wherein the wafer fixture comprises a one-way vent for releasing air from the between the back surface of the wafer and the base.

9. The wafer fixture of claim 1, further comprising electrical contacts for electrochemical etch stop processing or electroplating the wafer.

10. An apparatus for wafer etch tooling comprising:
a housing comprising a base, the base having a first sealing ring for receiving the wafer thereon;

a thrust plate configured to be received by the housing with the wafer positioned between the base and the thrust plate and including a second sealing ring for resting on a surface of the wafer; and a clamp having means for securing the wafer and thrust plate between the housing and the clamp upon rotation of the clamp within the housing.

11. The wafer fixture of claim 10, wherein the thrust plate is configured to remain stationary upon rotation of the clamp.

12. The wafer fixture of claim 11, further comprising a handle.

13. The wafer fixture of claim 12, wherein the wafer fixture comprises at least one vent for releasing air from the between the back surface of the wafer and the base.

14. The wafer fixture of claim 13, wherein the vent comprises a filter to keep condensation from traveling through the vent.

15. The wafer fixture of claim 10, further comprising a setting tool for assisting in rotation of the clamp.

16. The wafer fixture of claim 10, further comprising electrical contacts for electrochemical etch stop processing or electroplating the wafer.

17. The wafer fixture of claim 10, wherein the means for securing the wafer between the housing and the thrust plate upon rotation of the clamp within the housing further comprises means for adjusting the torque for securing the wafer.

18. A process by which material is added or subtracted to a wafer, the process comprising:
providing a housing having a base and at least one flexure pin around an inner circumference of the housing, the base having a first gasket for sealing the back surface of the wafer from a wet process;

positioning a wafer on the gasket of the base;

providing a thrust plate with a second gasket, and positioning the thrust plate over the wafer such that the second gasket rests on the front surface of the wafer, wherein the thrust plate is configured to allow at least a portion of the front surface of the wafer to be exposed to the wet process;

positioning a flexure clamp over the thrust plate and securing the flexure clamp to the housing by rotating the flexure clamp, wherein the thrust plate remains stationary upon rotation of the flexure clamp; and wet processing the exposed surface of the wafer.

19. The process of claim 18, wherein the wet process is generic isotropic wet etching, anisotropic wet etching, electrochemical etch-stop processing, plating, or electroplating.

* * * * *